(12) United States Patent
Wen et al.

(10) Patent No.: US 11,742,772 B1
(45) Date of Patent: Aug. 29, 2023

(54) PARALLEL ASSEMBLY OF RECTIFIER MODULES, RECTIFIER CABINET AND DC POWER SUPPLY SYSTEM THEREOF

(71) Applicant: Shanghai Baizhu Chenghang New Energy Co., Ltd., Shanghai (CN)

(72) Inventors: Senlin Wen, Shanghai (CN); Hongyuan Jin, Shanghai (CN)

(73) Assignee: SHANGHAI BAIZHU CHENGHANG NEW ENERGY CO., LTD., Shanghai (CN)

( * ) Notice: Subject to any disclaimer, the term of this patent is extended or adjusted under 35 U.S.C. 154(b) by 0 days.

(21) Appl. No.: 18/088,702

(22) Filed: Dec. 26, 2022

(30) Foreign Application Priority Data

May 17, 2022 (CN) .......................... 202210536577.9

(51) Int. Cl.
*H02M 7/00* (2006.01)
*H02B 1/30* (2006.01)
*H02M 3/00* (2006.01)
*H02B 1/04* (2006.01)
*H05K 7/20* (2006.01)

(52) U.S. Cl.
CPC .............. *H02M 7/003* (2013.01); *H02B 1/04* (2013.01); *H02B 1/30* (2013.01); *H02M 3/003* (2021.05); *H05K 7/20909* (2013.01)

(58) Field of Classification Search
CPC ...... H02M 7/003; H02M 7/08; H02M 1/0048; H02M 1/12; H05K 7/20909; H05K 7/14329; H05K 7/1432; H05K 2201/10272; H05K 7/2089; H05K 7/209
USPC ...................................................... 361/679.01
See application file for complete search history.

(56) References Cited

U.S. PATENT DOCUMENTS

| 6,281,602 B1* | 8/2001 | Got ........................... H02J 1/10 307/18 |
| 6,650,967 B1* | 11/2003 | Got ........................... H02J 1/00 307/64 |
| 2007/0217178 A1* | 9/2007 | Johnson, Jr. ......... H05K 7/1457 361/826 |
| 2018/0076726 A1* | 3/2018 | Hsiao ..................... H02M 7/003 |
| 2018/0352685 A1* | 12/2018 | Wan .................... H05K 7/20909 |
| 2019/0356159 A1* | 11/2019 | Coccia ................. H05K 7/1492 |

FOREIGN PATENT DOCUMENTS

| CN | 104852591 A | 8/2015 |
| CN | 204578343 U | 8/2015 |
| CN | 110783827 A | 2/2020 |
| CN | 110875689 A | 3/2020 |
| CN | 210693523 U | 6/2020 |
| CN | 213817242 U | 7/2021 |

* cited by examiner

*Primary Examiner* — Mandeep S Buttar
(74) *Attorney, Agent, or Firm* — IPro, PLLC

(57) ABSTRACT

The parallel assembly of rectifier modules includes a plurality of rectifier modules connected in parallel, a switch for switching-in and switching-out of the rectifier modules, an assembly frame, being provided therein with a switch accommodating space and a rectifier module accommodating space; a DC bus bar, being arranged at the top of the assembly frame; a plurality of groups of connectors, being fixed at one end close to the back side of the assembly frame; an AC copper bar, being fixed at one end close to the front side of the assembly frame; an extended copper bar, being fixed at one end close to the back side of the assembly frame.

16 Claims, 13 Drawing Sheets

PARALLEL ASSEMBLY OF RECTIFIER MODULES, RECTIFIER CABINET AND DC POWER SUPPLY SYSTEM THEREOF

PRIORITY CLAIM

This application claims the benefit of and priority to Chinese Patent Application No. 202210536577.9, filed to the China Patent Office on May 17, 2022 and entitled "Parallel Assembly of Rectifier Modules, Rectifier Cabinet and DC Power Supply System Thereof" which is hereby incorporated by reference in its entirety.

TECHNICAL FIELD

Embodiments of the present application relate to the technical field of power supply, and in particular, relate to a parallel assembly of rectifier modules, a rectifier cabinet and a DC power supply system thereof.

BACKGROUND

Power supplies of medium and high power are important infrastructures in data centers, electric vehicle charging, renewable new energy, and energy storage and or the like. Due to the limitation in performance of power devices, power supplies of medium and high power are generally realized by parallel connection of power devices, parallel connection of power modules or power units, and parallel connection of power supply systems, or a combination of these three methods. In addition to high efficiency and high reliability, the power supply system also proposes higher requirements on power density and cost.

High-voltage DC power supply systems currently available connect three-phase medium-voltage commercial power to a phase-shifting transformer through a medium-voltage switch so as to transform the three-phase medium-voltage commercial power into multi-winding low-voltage three-phase alternating current, which is then input to a plurality of parallel rectifier modules respectively through a low-voltage switch. The outputs of all rectifier modules are connected to positive and negative DC buses, and loads and battery packs are respectively connected through DC power distribution. That is, the current high voltage DC power supply is realized through the parallel connection of numerous rectifier modules.

As compared to the traditional data center power supply systems, the high-voltage DC power supply scheme with multiple rectifier modules in parallel has obvious advantages in volume, efficiency, and cost. Therefore, it has been rapidly developed and applied at present.

However, the large data center power supply system established based on this power supply scheme features high rated power and low AC voltage (240VAC or 336VAC) output by the phase-shifting transformer. This requires the AC cables from the output winding of the phase-shifting transformer to the rectifier module to have larger current carrying capacity. Besides, more parallel rectifier modules are needed and the total cable length required is longer, therefore, the cost of low-voltage AC cables higher.

In addition, it is also expected to provide a more reasonable layout design to minimize the area occupied by the rectifier cabinet composed of a large number of rectifier modules and DC collecting output and load branches thereof.

SUMMARY

The present application discloses a parallel assembly of rectifier modules. The parallel assembly of rectifier modules includes a plurality of rectifier modules connected in parallel, a switch for switching-in and switching-out of the rectifier modules, an assembly frame, being provided therein with a switch accommodating space and a rectifier module accommodating space which are sequentially arranged along the height direction; a DC bus bar, being arranged at the top of the assembly frame and located outside the assembly frame; the DC bus bar includes a DC bus bar positive pole and a DC bus bar negative pole; a plurality of groups of connectors, being fixed at one end close to the back side of the assembly frame and located in the rectifier module accommodating space; each group of connectors comprising an input connector and an output connector; an AC copper bar, being fixed at one end close to the front side of the assembly frame and located in the switch accommodating space; wherein the AC copper bar comprises an AC input copper bar and an AC output copper bar; extended copper bar, being fixed at one end close to the back side of the assembly frame and located in the switch accommodating space; wherein the AC input copper bar and the AC output copper bar are electrically connected with the switch, the extended copper bar is electrically connected with the AC output copper bar, and the extended copper bar is electrically connected with the input connector; the output connector is electrically connected to the DC bus bar; the outer surface of the rectifier modules is provided with a pair of plug interfaces which are matched with a group of the connectors so that the rectifier modules installed in the rectifier module accommodating space are electrically connected with the input connector and the output connector through the plug interfaces.

In some embodiments, the assembly frame includes: a plurality of plates straddling the assembly frame, and an interval exists between two adjacent plates in the height direction so that the rectifier module accommodating space is divided into two or more layers; a connector bracket being fixedly connected to the end of the plate that is near the back side of the assembly frame; the connector is fixed on the connector bracket.

In some embodiments, there is a guide groove on the plate where the guide groove is configured to guide the rectifier module to move to a target installation position in the rectifier module accommodating space so that the plug interface of the rectifier module is plugged with the corresponding connector.

In some embodiments, the rectifier module includes: a chassis, having two opposite surfaces provided with a plurality of ventilation holes to form an airflow channel for air passing through; a cooling fan, being fixed at one end of the chassis to drive the air in the airflow channel; circuit devices, being accommodated in the chassis.

In some embodiments, the chassis further includes: a handle, being arranged on a first surface of the chassis; a plurality of installation holes, being arranged on the first surface of the chassis and configured to fix the rectifier module; a plurality of indicator lights, being arranged on the first surface of the chassis; wherein the plug interface is arranged on a second surface of the chassis; and the first surface and the second surface are opposite.

In some embodiments, the parallel assembly of rectifier modules further includes: a plurality of rolling wheels, being arranged at the bottom of the assembly frame; a communication interface, being arranged on the top of the front side of the assembly frame; both a communication connection end of the rectifier module and the control end of the switch are electrically connected with the communication interface.

In some embodiments, the AC copper bar extends outward from the housing of the switch; the extended copper bar includes a copper bar body located at one end close to the back side of the assembly frame and a conductive connecting piece extending to the AC output copper bar; wherein the extended copper bar and the input connector as well as the output connector and the DC bus bar is electrically connected by flexible cables.

The present application discloses a rectifier cabinet. The rectifier cabinet includes: a rectifier cabinet body having two opposite side surfaces respectively provided with a first cabinet door and a second cabinet door and a heat dissipation air duct located at the central position of the rectifier cabinet body ; and the parallel assembly of rectifier modules as described above; wherein the parallel assembly of rectifier modules includes a first parallel assembly of rectifier modules located in the first accommodating space between the heat dissipation air duct and the first cabinet door, and a second parallel assembly of rectifier modules located in the second accommodating space between the heat dissipation air duct and the second cabinet door; wherein a non-wiring surface at one end of the first parallel assembly of rectifier modules is close to the first cabinet door, and a wiring surface at the other end of the first parallel assembly of rectifier modules is close to the heat dissipation air duct; a non-wiring surface at one end of the second parallel assembly of rectifier modules is close to the second cabinet door, and a wiring surface at the other end of the second parallel assembly of rectifier modules is close to the heat dissipation air duct.

In some embodiments, the rectifier cabinet further includes: busbars respectively positioned above the parallel assemblies of rectifier modules; the busbar includes a first busbar located above the first parallel assembly of rectifier modules and a second busbar located at the second parallel assembly of rectifier modules, wherein the first busbar includes a first busbar positive pole and a first busbar negative pole, an installation connection surface of the first busbar positive pole faces the first cabinet door, and an installation connection surface of the first busbar negative pole faces the top of the rectifier cabinet body; the second busbar includes a second busbar positive pole and a second busbar negative pole, an installation connection surface of the second busbar positive pole faces the second cabinet door, and an installation connection surface of the second busbar negative pole faces the top of the rectifier cabinet body; the DC bus bar positive pole is connected to the first busbar positive pole or the second busbar positive pole, and the DC bus bar negative pole is connected to the first busbar negative pole or the second busbar negative pole.

In some embodiments, the rectifier cabinet further includes: a plurality of load copper bars comprising load copper bar positive poles and load copper bar negative poles, a plurality of fuses and a plurality of current sensors; wherein the plurality of load copper bar positive poles, the plurality of load copper bar negative poles, the plurality of fuses and the plurality of current sensors are arranged in a staggered way along the height direction of the rectifier cabinet body; the plurality of load copper bar positive poles, the plurality of load copper bar negative poles, the plurality of fuses and the plurality of current sensors are arranged in parallel along the width direction of the rectifier cabinet body; the installation connection surfaces of the plurality of load copper bar positive poles and the plurality of load copper bar negative poles all face the first cabinet door or the second cabinet door.

In some embodiments, the rectifier cabinet body includes: an installation frame located at the bottom of the rectifier cabinet body; the installation frame of the parallel assembly of rectifier modules is matched with the assembly frame of the parallel assembly of rectifier modules; the parallel assembly of rectifier modules is fixed on the installation frame of the parallel assembly of rectifier modules in a detachable way.

In some embodiments, the rectifier cabinet body further includes: a fan, being installed at the top of the rectifier cabinet body, an air inlet of the fan is connected with an air outlet of the heat dissipation air duct of the rectifier cabinet.

In some embodiments, the rectifier cabinet body further includes: a first monitoring circuit connected to the first parallel assembly of rectifier modules and a second monitoring circuit connected to the second parallel assembly of rectifier modules; the first monitoring circuit being arranged at the inner side of the first cabinet door; the second monitoring circuit being arranged at the inner side of the second cabinet door; a first display screen and a plurality of first indicator lights connected to the first monitoring circuit, and a second display screen and a plurality of second indicator lights connected to the second monitoring circuit; wherein the first display screen and the first indicator lights are arranged at the outer side of the first cabinet door; and the second display screen and the second indicator lights are arranged at the outer side of the second cabinet door.

In some embodiments, a communication interface of each of the parallel assemblies of rectifier modules is connected to the nearest monitoring circuit.

The present application discloses a DC power supply system. The DC power supply system includes: a transformer cabinet, having two opposite side surfaces respectively provided with a third cabinet door and a fourth cabinet door, and both one side close to the third cabinet door and one side close to the fourth cabinet door in the transformer cabinet are provided with low-voltage winding wiring terminals; and the rectifier cabinet as described above; wherein an AC output end of the transformer cabinet is near to the rectifier cabinet, and the rectifier cabinet is located at one side of the transformer cabinet on which the low-voltage winding wiring terminals are arranged.

DETAILED DESCRIPTION

Hereinafter, the present application will be described in detail with reference to specific embodiments. The following embodiments will facilitate further understanding of the present application by those skilled in the art, but they do not limit the present application in any way. It shall be noted that, many modifications and improvements may be made by those skilled in the art without departing from the concept of the present application, and all these modifications and improvements belong to the scope claimed in the present application.

In order to make objectives, technical solutions and advantages of the present application clearer, the present application will be further described in detail below with reference to attached drawings and embodiments. It shall be appreciated that, the specific embodiments described herein are only used to explain the present application, and are not intended to limit the present application.

Figure 1:
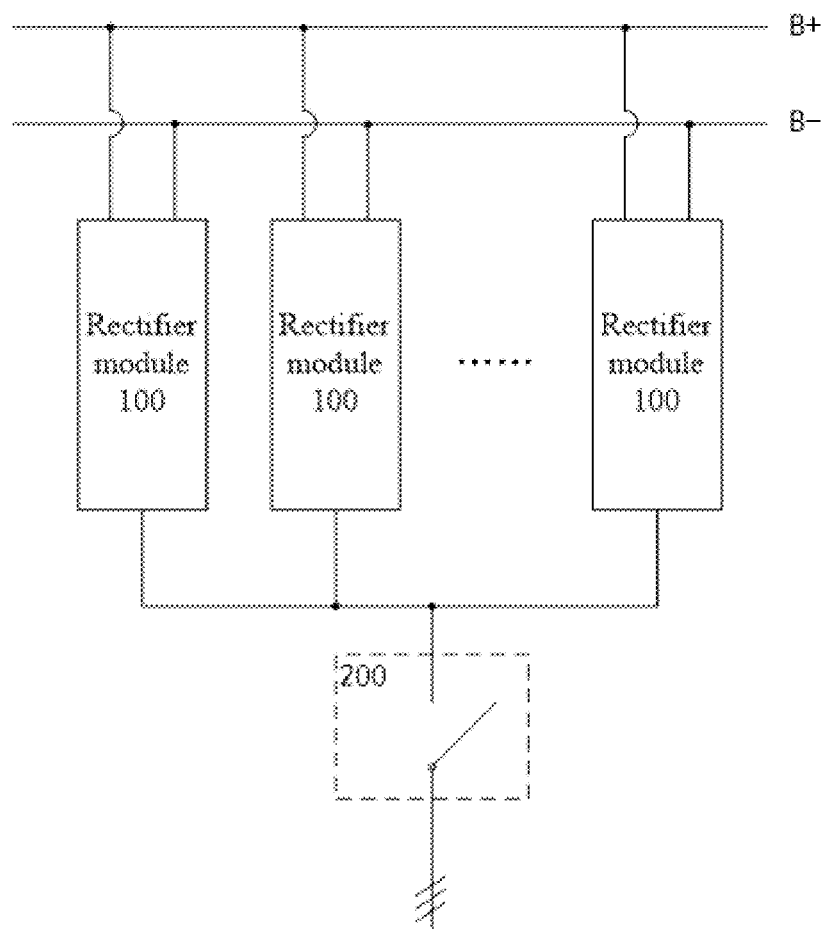
FIG. 1 is a schematic circuit diagram of a parallel assembly of rectifier modules according to an embodiment of the present application.

Please refer to FIG. 1, which is a schematic circuit diagram of a parallel assembly of rectifier modules according to an embodiment of the present application. The parallel assembly may be composed of a plurality of rectifier modules 100 connected in parallel and a switch 200 to realize the conversion from three-phase alternating current to direct current as well as parallel output.

The low-voltage three-phase alternating current may be distributed to a plurality of parallel branches after passing through the switch 200 to supply power to the rectifier module 100 on each parallel branch. Outputs of the plurality of rectifier modules 100 are connected in parallel to the positive pole B+ and the negative pole B− of the DC bus, thereby realizing parallel output of direct current.

The switch 200 (e.g., a circuit breaker) may be switched between the turning-on state and the turning-off state according to needs of the actual situation so as to control the switching-in and switching-out of the rectifier module 100 connected to thereto, thus playing a protective role.

Figure 2:
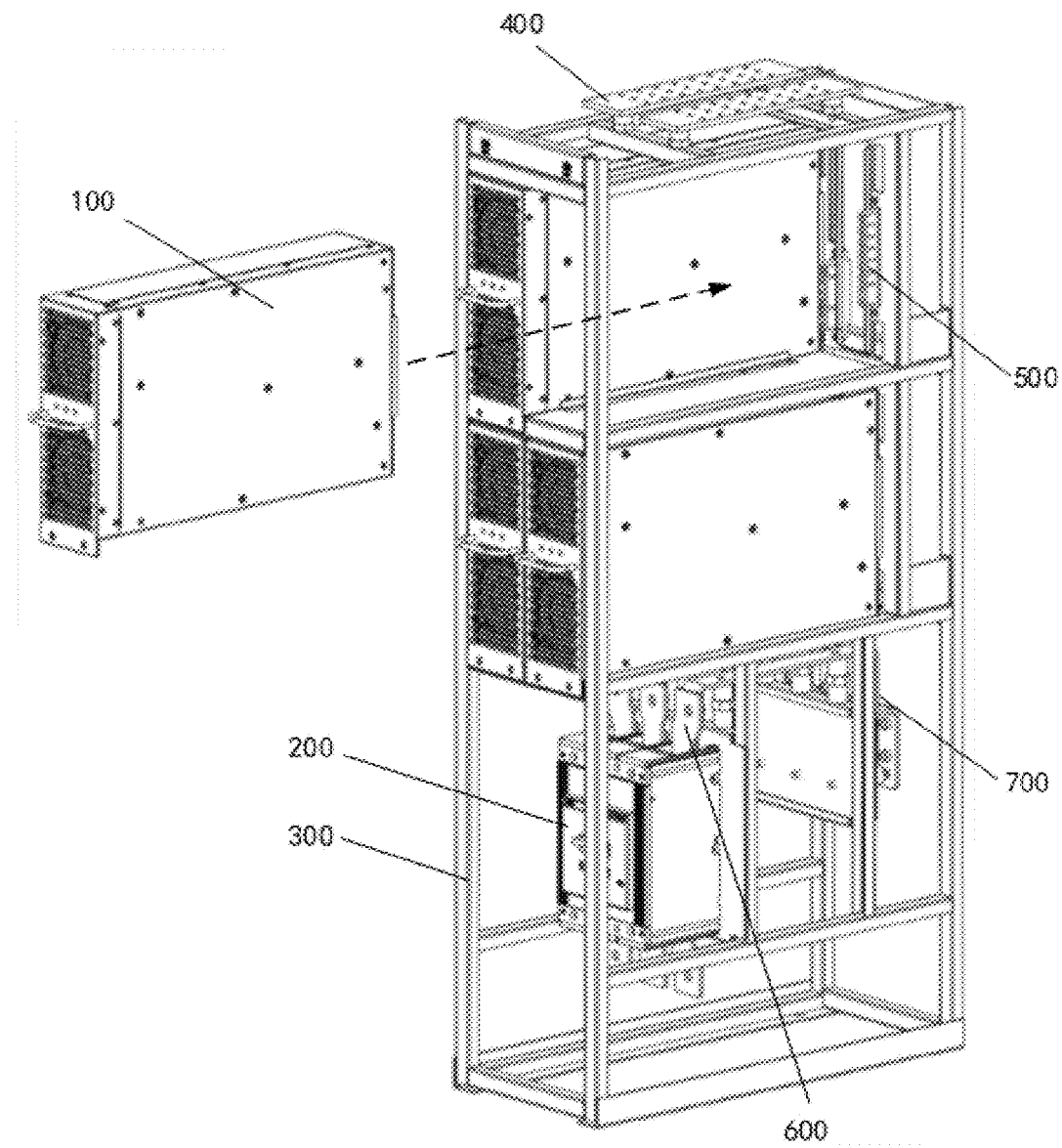
FIG. 2 is a schematic principal diagram of a parallel assembly of rectifier modules according to an embodiment of the present application.

In order to achieve a series of effects, such as reducing the volume and area occupied, reducing the cost, and facilitating the maintenance, the parallel assembly of rectifier modules shown in FIG. 1 may be arranged in a suitable structural layout. Please refer to FIG. 2, which is a schematic structural diagram of a parallel assembly of rectifier modules provided according to an embodiment of the present application. In FIG. 2, four rectifier modules 100 are taken as examples for description, but the number of rectifier modules included in each assembly may also be increased or decreased by those skilled in the art according to needs of the actual situation.

In addition to the plurality of rectifier modules 100 and the switch 200, the parallel assembly of rectifier modules further includes an assembly frame 300, a DC bus bar 400, a connector 500, an AC copper bar 600 and an extended copper bar 700.

The assembly frame 300 is the main frame structure of the whole assembly, which is used to provide mounting and fixing positions for various functional components to form the required structural layout. In this embodiment, for simplicity of description, please refer to FIG. 3, which is a schematic structural diagram of an assembly frame according to an embodiment of the present application, the side of the assembly frame 300 near the left side of the attached drawing is called the "front side F", and the side of the assembly frame 300 opposite to the front side F is called the "back side B". In addition, the part of the assembly frame 300 near the top of the attached drawing is called the "top part T", while the part thereof near the bottom of the attached drawing is called the "bottom part G".

Inside the assembly frame 300, a rectifier module accommodating space 310 for accommodating the rectifier modules 100 and a switch accommodating space 320 for accommodating the switch 200 may be formed by spacer structures such as plates or other similar structures.

In some embodiments, the spacer structure may be a plate 330 straddling the assembly frame 300. There may be a plurality of plates 330, which are respectively arranged at different heights of the assembly frame 300. In this embodiment, two plates (i.e., a first plate 330a and a second plate 330b) are taken as examples for description.

Figure 3:
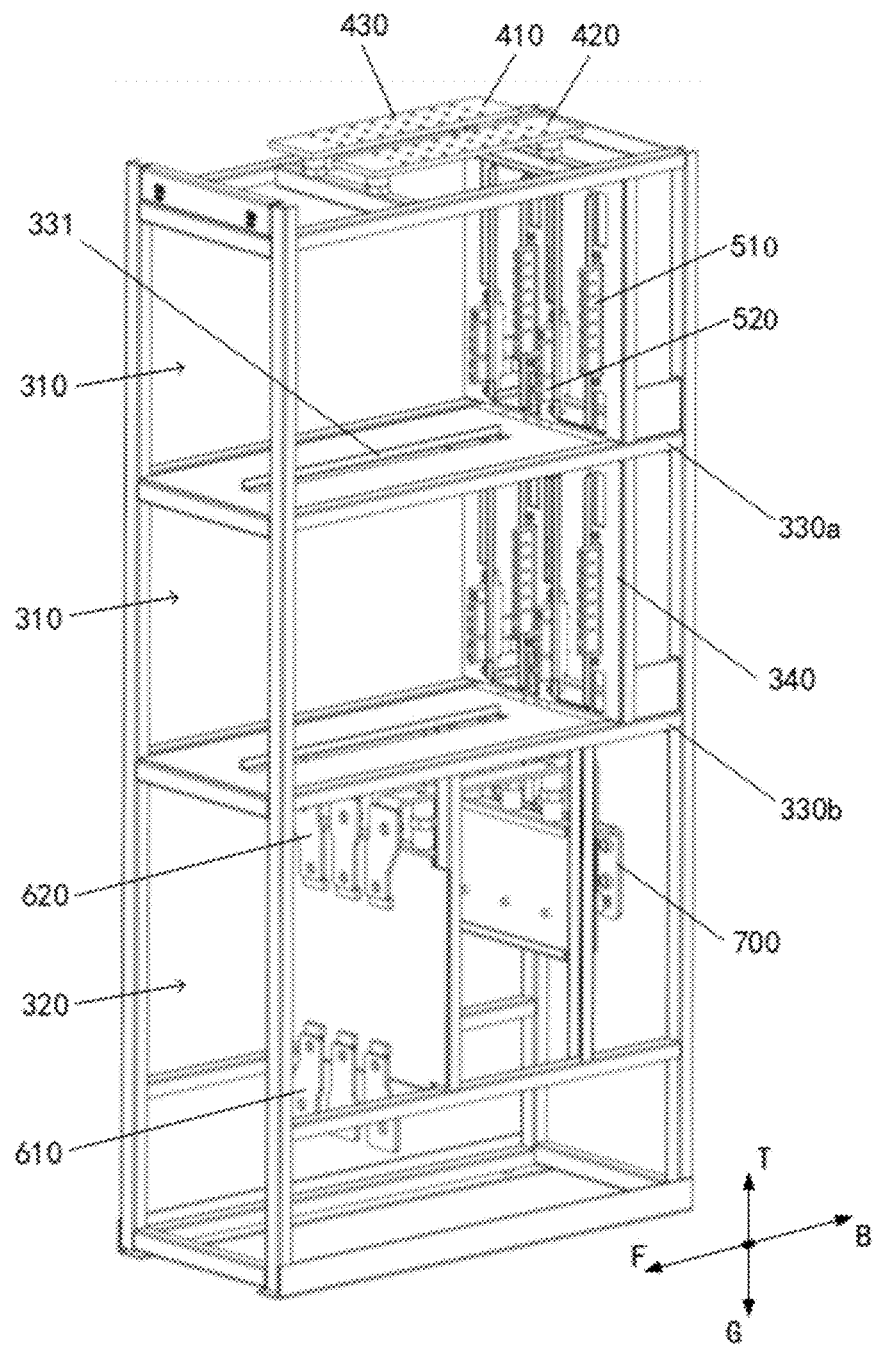
FIG. 3 is a schematic structural diagram of an assembly frame according to an embodiment of the present application.

Referring to FIG. 3, the first plate 330a divides the assembly frame into upper and lower parts, thereby forming a switch accommodating space 320 located at the lower part and a rectifier module accommodating space 310 located at the upper part. The second plate 330b is located between the first plate 330a and the top of the assembly frame 300 to divide the rectifier module accommodating space 310 into upper and lower layers.

The DC bus bar 400 is a component arranged at the top of the frame assembly 300, and it may be fixedly connected with the outer surface of the frame assembly 300 by any suitable means. As shown in FIG. 3, the DC bus bar includes a DC bus bar positive pole 410 and a DC bus bar negative pole 420, which are respectively used as the DC bus positive pole and the DC bus negative pole of the parallel assembly of rectifier modules. Specifically, a plurality of groups of wiring nuts 430 for connecting cables may be riveted on the surface of the DC bus bar 400.

In a preferred embodiment, in order to facilitate the electrical connection between the output connector 520 and the DC bus bar 400, the DC bus bar 400 may be arranged near the back side of the assembly frame to shorten the cable length.

A plurality of groups of connectors 500 are provided. Each group of connectors 500 may correspond to one rectifier module 100, and include an input connector 510 and an output connector 520 for connecting the rectifier module 100 to a certain parallel branch. As shown in FIG. 3, the connector 500 locates in the rectifier module accommodating space 310, and is fixed at one end close to the back side B of the assembly frame 300.

In some embodiments, still referring to FIG. 3, the assembly frame 300 is provided with a connector bracket 340 at the end of the plate 330 that is near the back side of the assembly frame. The connector 500 may be located at one end of the rectifier module accommodating space 310 that is close to the back side B of the assembly frame 300 by being fixed to the connector bracket 340. Specifically, the connector 500 may be fixed on the connector bracket 340 by any suitable type of fixed connection modes, and this is not particularly limited herein.

The AC copper bar 600 is a connection port for input of external low-voltage three-phase alternating current. As a component adjacent to the switch 200, the AC copper bar 600 may be fixed at one end close to the back side of the assembly frame and located in the switch accommodating space 320. As shown in FIG. 3, the AC copper bar 600 may include an AC input copper bar 610 and an AC output copper bar 620, the AC input copper bar 610 and the AC output copper bar 620 are respectively nodes before and after the switch 200 and are all electrically connected with the switch 200.

Figure 4:
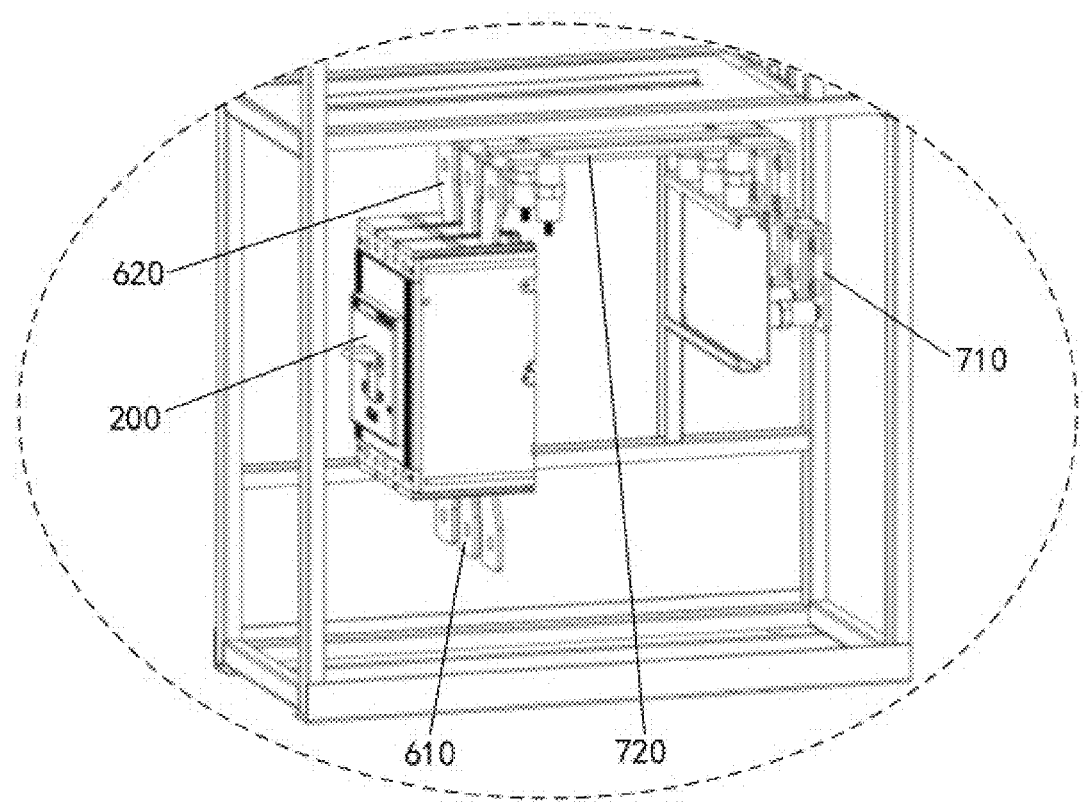
FIG. 4 is a microstructure diagram of a parallel assembly of rectifier modules according to an embodiment of the present application.

In some embodiments, referring to FIG. 4, the AC input copper bar 610 and the AC output copper bar 620 may be plate-shaped structures extending outward from the housing of the switch 200.

The AC input copper bar 610 and the AC output copper bar 620 respectively extend from different sides of the housing of the switch 200. For example, the AC input copper bar 610 may be located above the switch, while the AC output copper bar 620 may be located below the switch.

The extended copper bar 700 is a component for connecting the AC copper bar 600 and the connector 500. As shown in FIG. 3, the extended copper bar 700 is arranged and fixed at one end close to the back side B of the assembly frame, but located in the switch accommodating space 320. In some embodiments, still referring to FIG. 4, in addition to the copper bar body 710 located on the back side B, the extended copper bar 700 may also have a connecting piece 720 extending to the AC output copper bar 620 to realize the electrical connection therebetween. Specifically, the extended copper bar 700 has the front and rear ends respectively fixed at one end close to the back side B of the assembly frame by fasteners. In addition, the extended copper bar 700 may also be electrically connected with each input connector 510 through cables.

Figure 5:
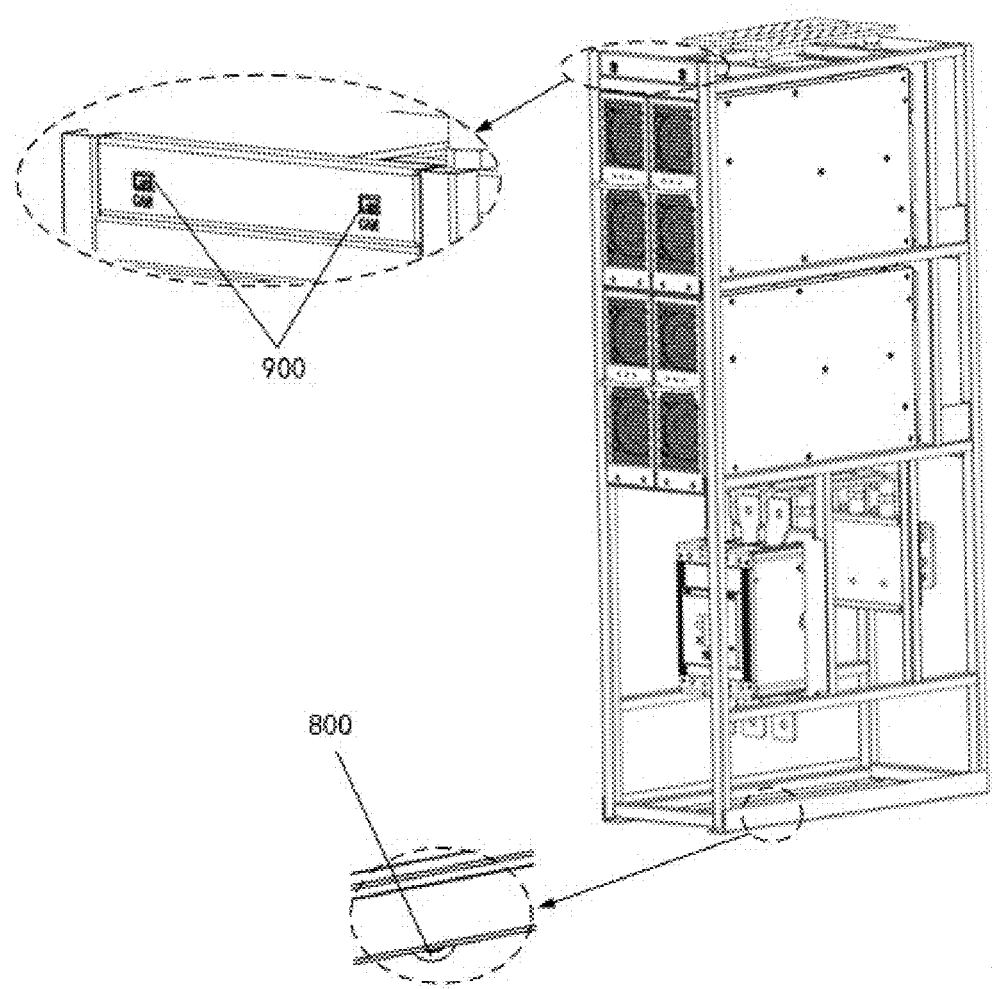
FIG. 5 is a microstructure diagram of a communication interface and rolling wheels of a parallel assembly of rectifier modules according to an embodiment of the present application.

In some other embodiments, referring to FIG. 5, the parallel assembly of rectifier modules may further include a plurality of rolling wheels 800 and a communication interface 900.

The rolling wheels 800 are arranged at the bottom of the assembly frame 300 so as to facilitate the installation and disassembly of the parallel assembly of rectifier modules.

The communication interface 900 is provided on the front side of the assembly frame. Communication connection ends of the plurality of rectifier modules 100 and a control end of the switch 200 are all electrically connected to the communication interface 900, so as to meet the requirements of reading the operating status information of the rectifier modules 100 and controlling the switch 200. Specifically, the communication interface 900 may be a CAN interface.

It shall be noted that, the directional and positional terms described in the embodiments of the present application are only used to illustrate the relativity of the positional relationships among various components, and are not intended to limit the specific directions or positions thereof. Substitutions or adjustments may be made by those skilled in the art according to the actual situation (for example, the front and back sides of the assembly frame 300 are interchangeable), and all these substitutions and adjustments are within the scope claimed in the present application.

During actual use, after the rectifier module 100 is installed in place, the plug interface located on the outer surface of the rectifier module 100 can be plugged with the corresponding connector, so that the rectifier module 100 is connected to the corresponding parallel branch.

The low-voltage three-phase alternating current from the outside enters through the AC input copper bar 610, passes through the switch 200, and then is fed to the input connectors 510 connected in parallel through the AC output copper bar 620 and the extended copper bar 700 in sequence, thereby supplying power for the rectifier module 100. The direct current output from each rectifier module 100 may be supplied to the DC bus bar 400 through the output connector 520, and then supplied to the back-end load.

When protection action needs to be triggered in case of an abnormal situation, the whole parallel assembly of rectifier modules may be switched out from the circuit by turning-off the switch 200.

At least one advantage of the parallel assembly of rectifier power modules according to the embodiment of the present application is that: the whole parallel assembly of rectifier power modules only has three interfaces to the outside, namely, an AC input, a DC collecting output and a communication port. It has the advantages of a simple structure, clear hierarchy, high power density, high degree of modularity, convenient production management and maintenance or the like. Moreover, such modular assembly can conveniently obtain rectifiers with different power levels through parallel design, and have a good application prospect.

Another advantage of the parallel assembly of rectifier modules according to the embodiment of the present application is that: based on parameters such as the rated current, the short-circuit breaking current of the switch (e.g., the circuit breaker), the rated current and short-circuit current of the rectifier modules and the number of rectifier modules and through accurate calculation and matching, a more suitable switch can be selected, and reliable short-circuit protection of parallel modules can be realized on the premise of fully applying the protection capability of the switch, thereby achieving high cost performance.

Figure 6A:
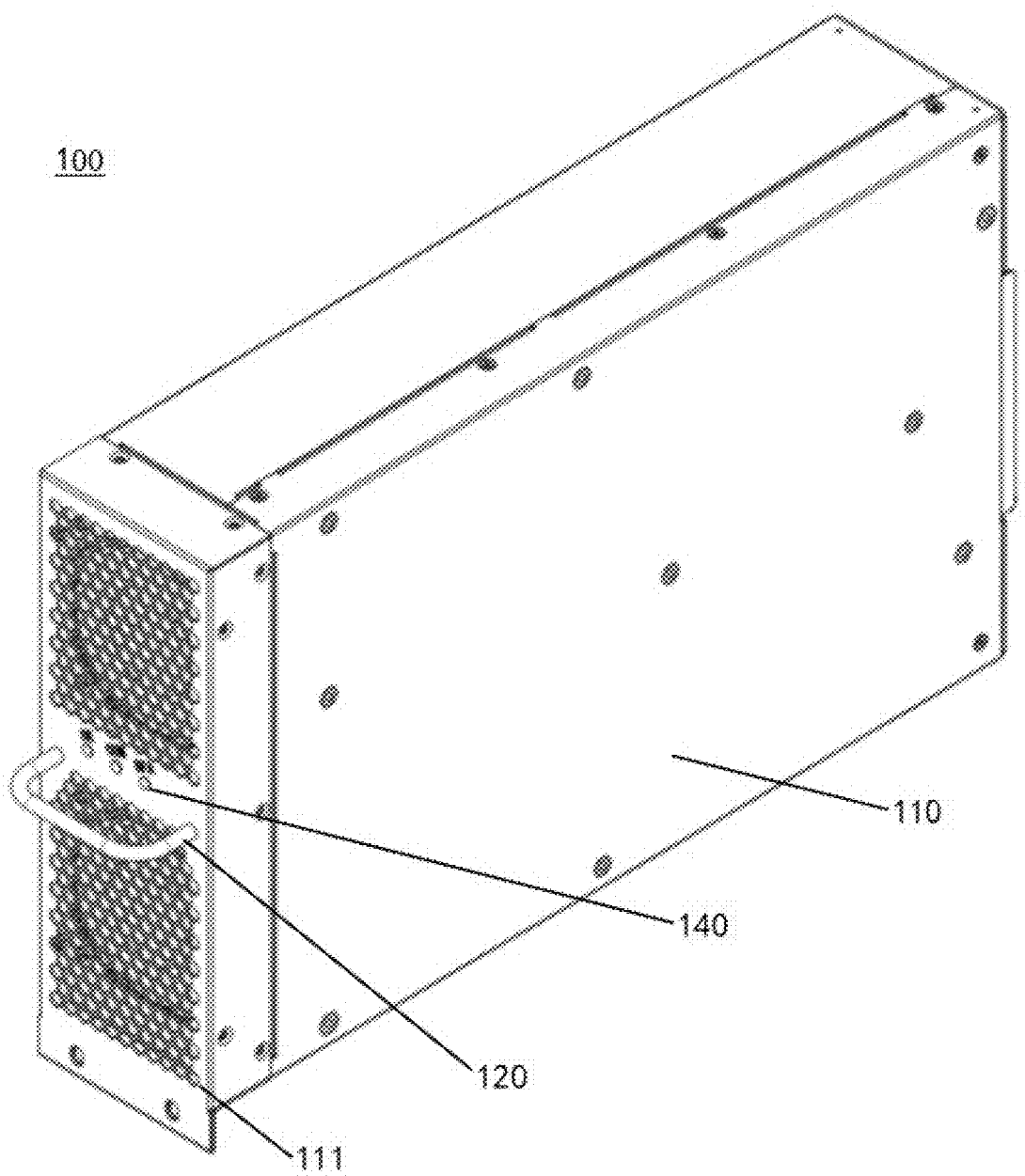
FIG. 6A and FIG. 6B are schematic structural diagrams of a rectifier module according to an embodiment of the present application.
Figure 6B:
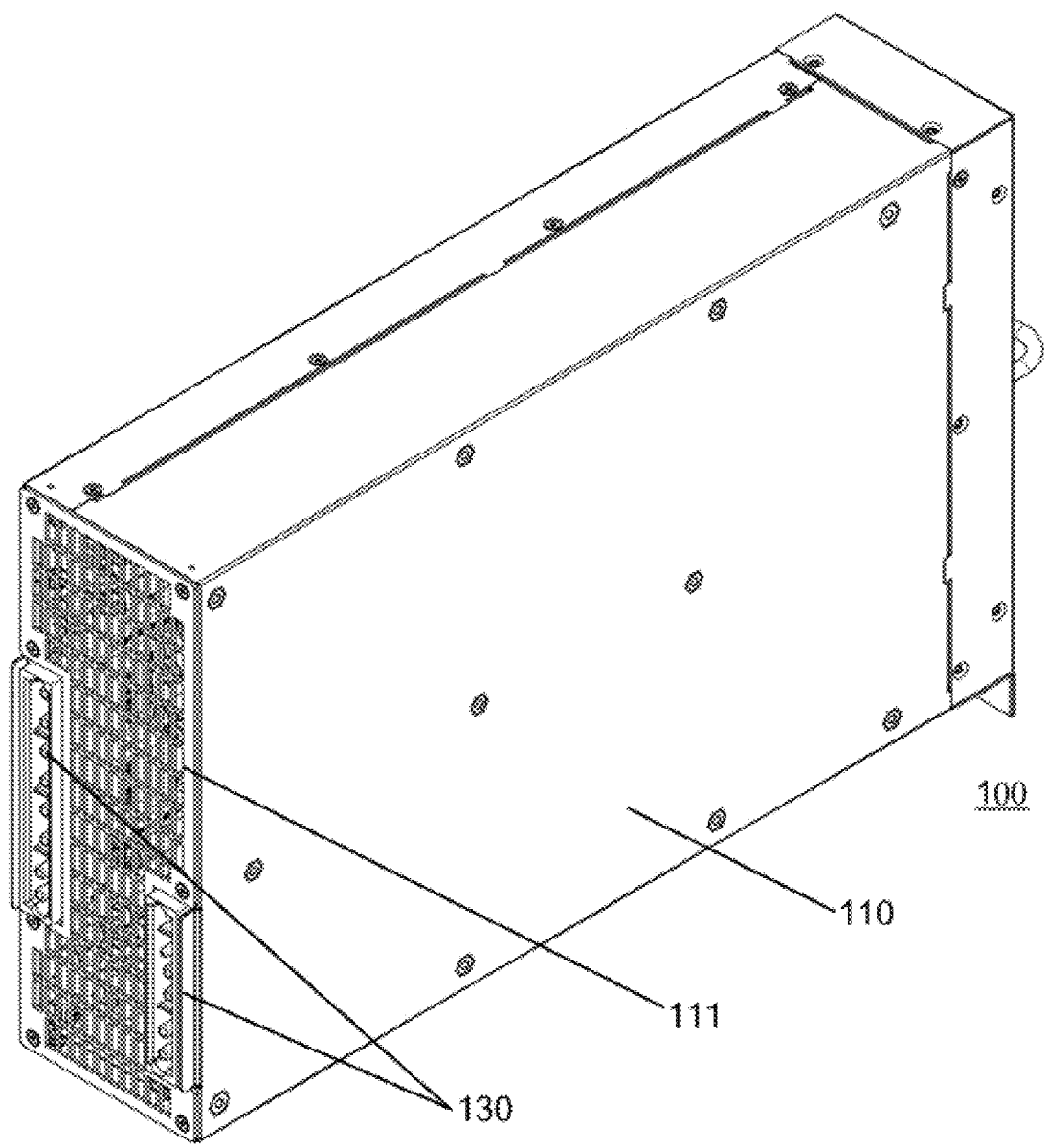

Correspondingly, the present application further discloses a rectifier module. The rectifier module may be used in the assembly frame of the above embodiment to achieve the corresponding technical effect. FIG. 6A and FIG. 6B are schematic structural diagrams of a rectifier module provided according to an embodiment of the present application. Referring to FIG. 6A and FIG. 6B, the rectifier module 100 includes a chassis 110, a handle 120, a plug interface 130 and circuit devices (not shown).

Figure 7:
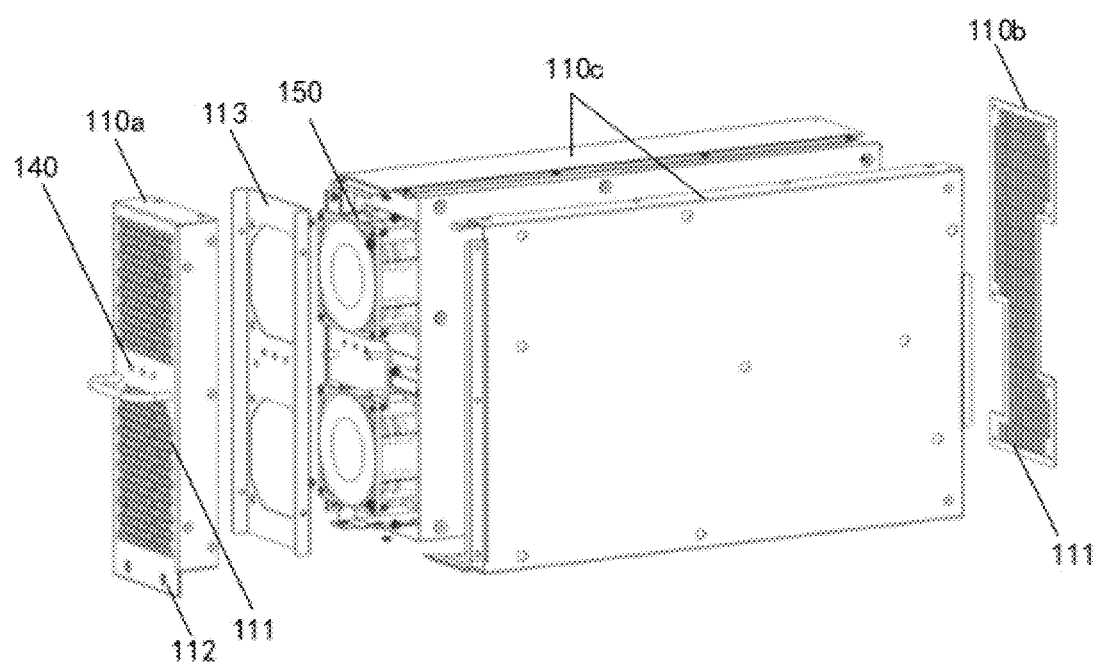
FIG. 7 is a schematic structural diagram of a rectifier module according to an embodiment of the present application.

The chassis 110 is the outer housing of the rectifier module. In this embodiment, the shape of the chassis 110 may be a cuboid that fits the assembly frame. Accordingly, the chassis 110 may also be designed into different shapes and structures according to needs of the actual situation. Particularly, as shown in FIG. 7, the chassis may be enclosed by a first panel 110a on the front side, a second panel 110b on the back side and a pair of side plates 110c on both sides.

At least a part of the areas of the first panel 110a and the second panel 110b opposite to each other of the chassis are opened with ventilation holes 111, thereby realizing air cooling and heat dissipation of circuit devices inside the chassis. Specifically, the arrangement density, shape, and hole size of the ventilation holes 111 may be set according to needs of the actual situation, and this is not particularly limited herein.

The handle 120 is disposed on the front side of the chassis 110, and the plug interface 130 is disposed on the back side of the chassis 110. Such a design may make it convenient for the operator to push the rectifier module 100 into the assembly frame 300 or pull the rectifier module 100 out of the assembly frame 300 by holding the handle 120, and realize the electrical connection between the plug interface 130 and the connector 500.

The circuit devices refer to electronic elements in the rectifier module that are needed to realize the rectifying function. The circuit devices are housed and protected in the chassis, and air flows through the ventilation holes 111 to dissipate the heat of the circuit devices inside the chassis.

In some embodiments, in order to assist in smoothly installing the rectifier module 100 at the target installation position, still referring to FIG. 3, the plate 330 may also have a guide groove 331. The guide groove 331 coincides with the long-side of the plate 330 and has a suitable length, and it can guide and limit the movement of the rectifier module 100, thereby ensuring that the plug interface 130 on the back side of the rectifier module 100 can be plugged into the connector 500.

During the actual assembling and disassembling processes of the rectifier module, the rectifier module 100 is pushed in or pulled out by the handle 120 on the front side of the rectifier module 100. For example, the rectifier module 100 is pushed into the target installation position under the guidance of the guide groove 331 so that the plug interface 130 located on the back side is plugged with the connector 500 to realize the electrical connection therebetween.

In some embodiments, referring to FIG. 7, the front side of the rectifier module 100 may also be provided with mounting holes 112 and one or more indicator lights 140.

The mounting holes 112 are used for fixing the rectifier modules 100. After the rectifier module 100 is pushed in place, the rectifier module 100 is fixed on the assembly frame 300 by fasteners such as fastening screws or the like. When the rectifier module 100 needs to be pulled out, the fasteners such as the fastening screws or the like are loosened, and then the rectifier module 100 is pulled out of the assembly frame 100 through the handle 120. Of course, the fixed connection between the rectifier module 100 and the assembly frame 300 can also be realized by those skilled in the art through any other suitable type of detachable fixing structures (e.g., buckles).

The indicator light 140 is a signal lamp for prompting the current operating status of the rectifier module 100. Specifically, any suitable number (e.g., three shown in FIG. 7) of indicator lights 140 may be set according to needs of the actual situation. By the on/off situation of the indicator light 140 or other signal combinations, those skilled in the art can conveniently and intuitively see the operating status of the rectifier module 100.

In some other embodiments, still referring to FIG. 7, the rectifier module 100 may further include therein a cooling fan 150 to enhance the heat dissipation effect of the internal circuit devices. The cooling fan 150 may be fixed above a fan bracket 113.

Accordingly, one or more functional components may also be added or removed in the rectifier module by those skilled in the art according to needs of the actual situation, and this is not limited by the attached drawings in the specification of the present application.

Figure 8A:
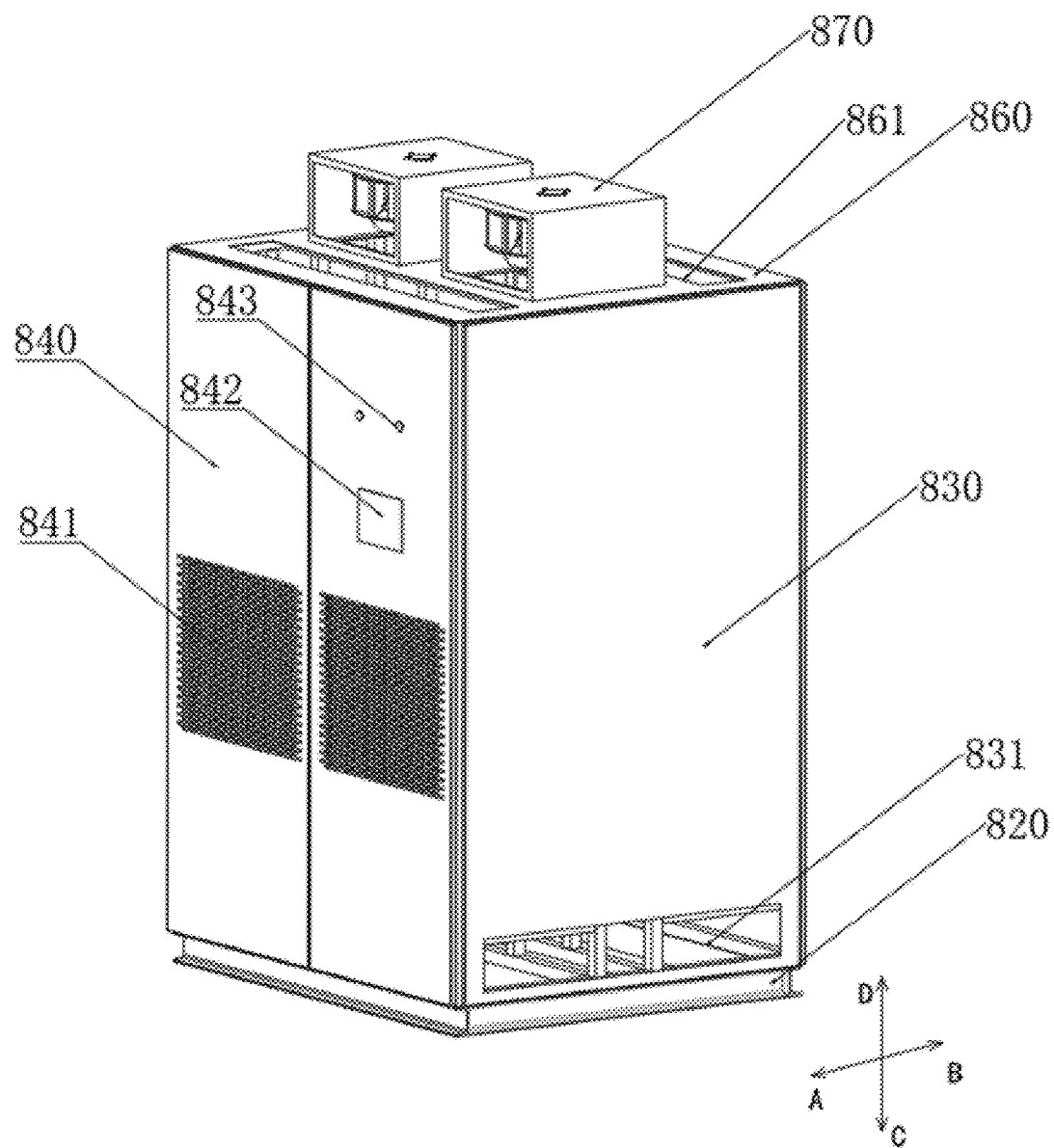
FIG. 8A and FIG. 8B are schematic structural diagrams of a rectifier cabinet body according to an embodiment of the present application.
Figure 8B:
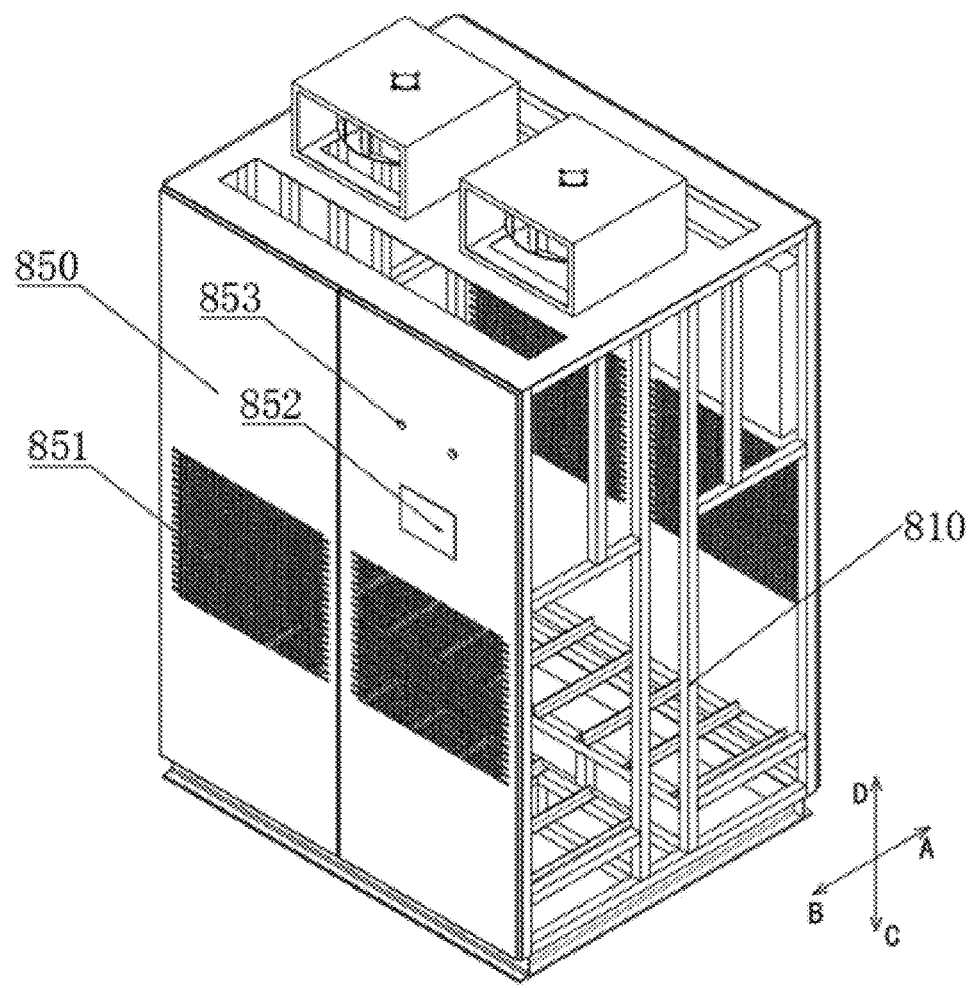

Referring to FIG. 8A and FIG. 8B, which are structural diagrams of a rectifier cabinet body according to an embodiment of the present application, the rectifier cabinet body includes an installation frame 810, a base 820, side plates 830, a first cabinet door 840, a second cabinet door 850, a top plate 860 and a fan 870.

The installation frame 810 is the main supporting structure of the rectifier cabinet body, which provides mounting and fixing foundation for various functional components to form the desired structural layout. In this embodiment, for simplicity of description, the side of the installation frame 810 near the left side of the attached drawing is called the "front side A", and the side of the installation frame 810 opposite to the front side A is called the "back side B". In addition, the part of the installation frame 810 near the top of the attached drawing is called the "top part D", while the part near the bottom of the attached drawing is called the "bottom part C".

In some embodiments, the side plate 830 is connected to the right side of the installation frame 810 by fasteners, wherein the right side described herein is defined by taking the front side A as the front side, the top plate 860 is connected to the side near the top part D of the installation frame 810 by fasteners, and the first cabinet door 840 and the second cabinet door 850 are respectively connected to the side near the front side A and the back side B of the installation frame 810 by hinges. Of course, the connection and fixation between the side plate 830 and the installation frame 810, the top plate 860 and the installation frame 810, as well as the first and second cabinet doors 840 and 850 and the installation frame 810 may also be achieved by those skilled in the art through any other suitable type of detachable fixing structures (e.g., buckles).

In some embodiments, both the first cabinet door 840 and the second cabinet door 850 are of double-door structures, and the left and right doors of the first cabinet door 840 are provided with ventilation windows 841, and the starting and ending positions of the height of the ventilation window 841 are approximately the same as the starting and ending positions of the height of the module panels of the parallel assembly of rectifier modules in the cabinet. A first display screen 842 and a plurality of first indicator lights 843 are arranged on the outer side of the right door of the first cabinet door 840. The first display screen 842 is located above the ventilation window 841, and the first indicator light 843 is located above the first display screen 842. In the horizontal direction, both the first indicator light 843 and the first display screen 842 are in the middle position in the width direction of the right door of the first cabinet door 840.

The left and right doors of the second cabinet door 850 are provided with ventilation windows 851, and the starting and ending positions of the height of the ventilation window 851 are approximately the same as the starting and ending positions of the height of the module panels of the parallel assembly of rectifier modules in the cabinet. A second display screen 852 and a plurality of second indicator lights 853 are arranged on the outer side of the right door of the second cabinet door 850. The second display screen 852 is located above the ventilation window 851, and the second indicator light 853 is located above the second display screen 852. In the horizontal direction, both the second indicator light 853 and the second display screen 852 are in the middle position in the width direction of the right door of the second cabinet door 850.

The first indicator light 843 and the second indicator light 853 are signal lamps respectively used to indicate the current operating status of the first monitoring circuit and the second monitoring circuit. Specifically, any suitable number (e.g., two shown in FIG. 8A and FIG. 8B) of indicator lights may be set according to the needs of the actual situation.

In some embodiments, a wire passage hole 831 is arranged at one end of the side plate 830 near the base 820, and the wire passage hole 831 is arranged along the width direction of the side plate 830. A wire passage hole 861 is arranged on each of two sides of the top plate 860 near the first cabinet door 840 and the second cabinet door 850.

In some embodiments, two fans 870 are further provided on the cabinet top 303, and the fans 870 are arranged in the middle of the two wire passage holes 861 of the top plate 860. An appropriate number of fans may be set according to actual needs.

In some embodiments, the fan 870 may be a centrifugal fan, an axial flow fan and a mixed flow fan, and in the embodiment of the present application, the centrifugal fan is preferred.

It shall be noted that if the rectifier cabinet body is divided into two parts along the cutting plane perpendicular to the plane of the side plate 830, then the second half of the rectifying cabinet may overlap with the first half of the rectifying cabinet by rotating 180 degrees around the plumb symmetry axis of the cutting plane.

Different from the prior art, by adopting the embodiment described above, the cooling air can enter the cabinet from the first cabinet door and the second cabinet door, enter the cavity of the chassis of the rectifier module from the panel ventilation holes of the parallel assembly of rectifier modules to dissipate heat of the devices, and hot air is discharged from the ventilation holes of the back plate of the rectifier module. The hot air flows to the shared middle heat dissipation air duct in the rectifier cabinet, passes through the air outlet at the top of the cabinet, and then is discharged to the outside through the fan. The air duct sealing plate between the rectifying cabinet, the parallel assembly of rectifier modules and the first accommodating space and the second accommodating space and the heat dissipation air duct or the like can effectively prevent air leakage and backflow of cooling airflow.

Figure 9A:
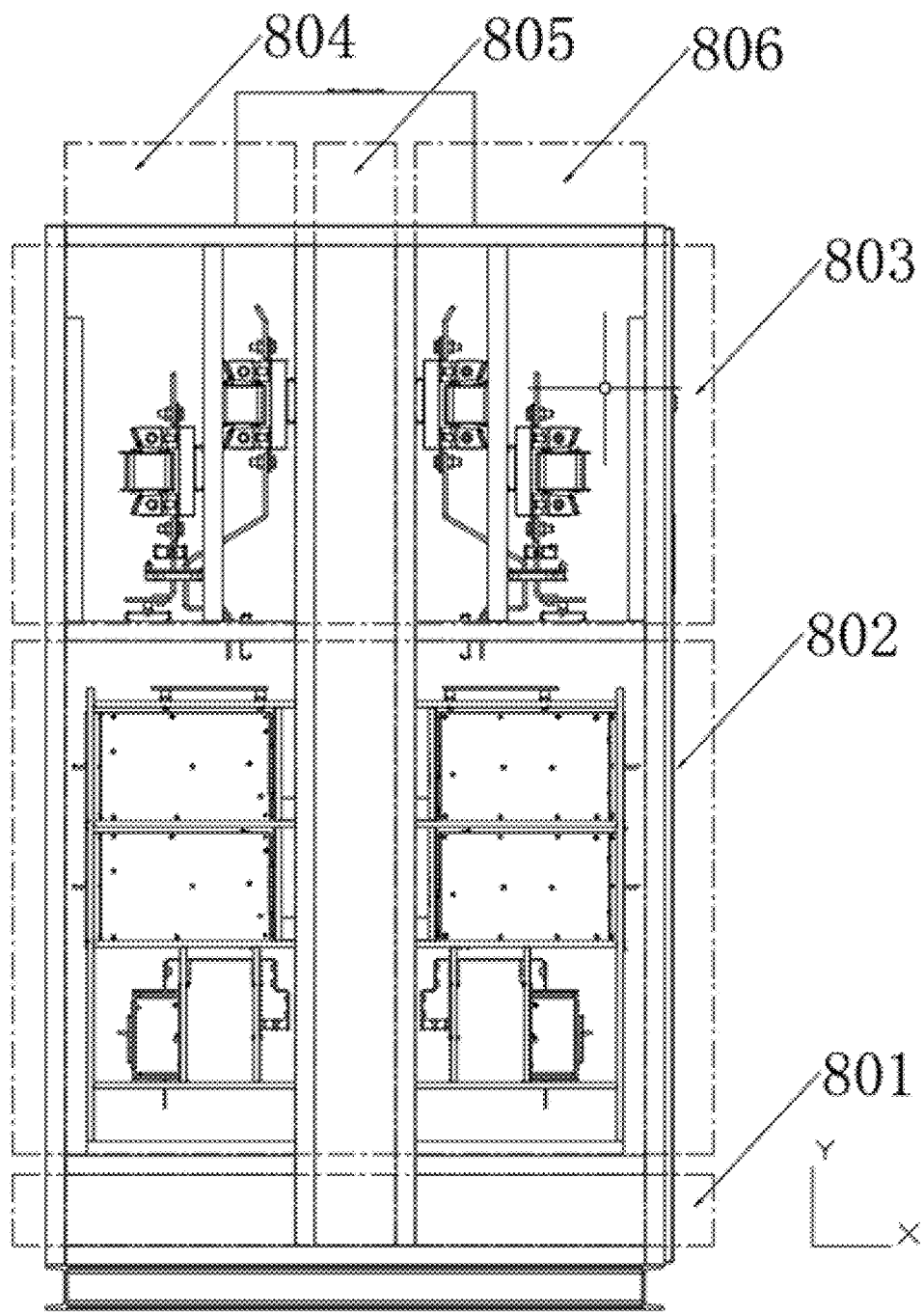
FIG. 9A and FIG. 9B are schematic structural diagrams of a rectifier cabinet according to an embodiment of the present application.
Figure 9B:
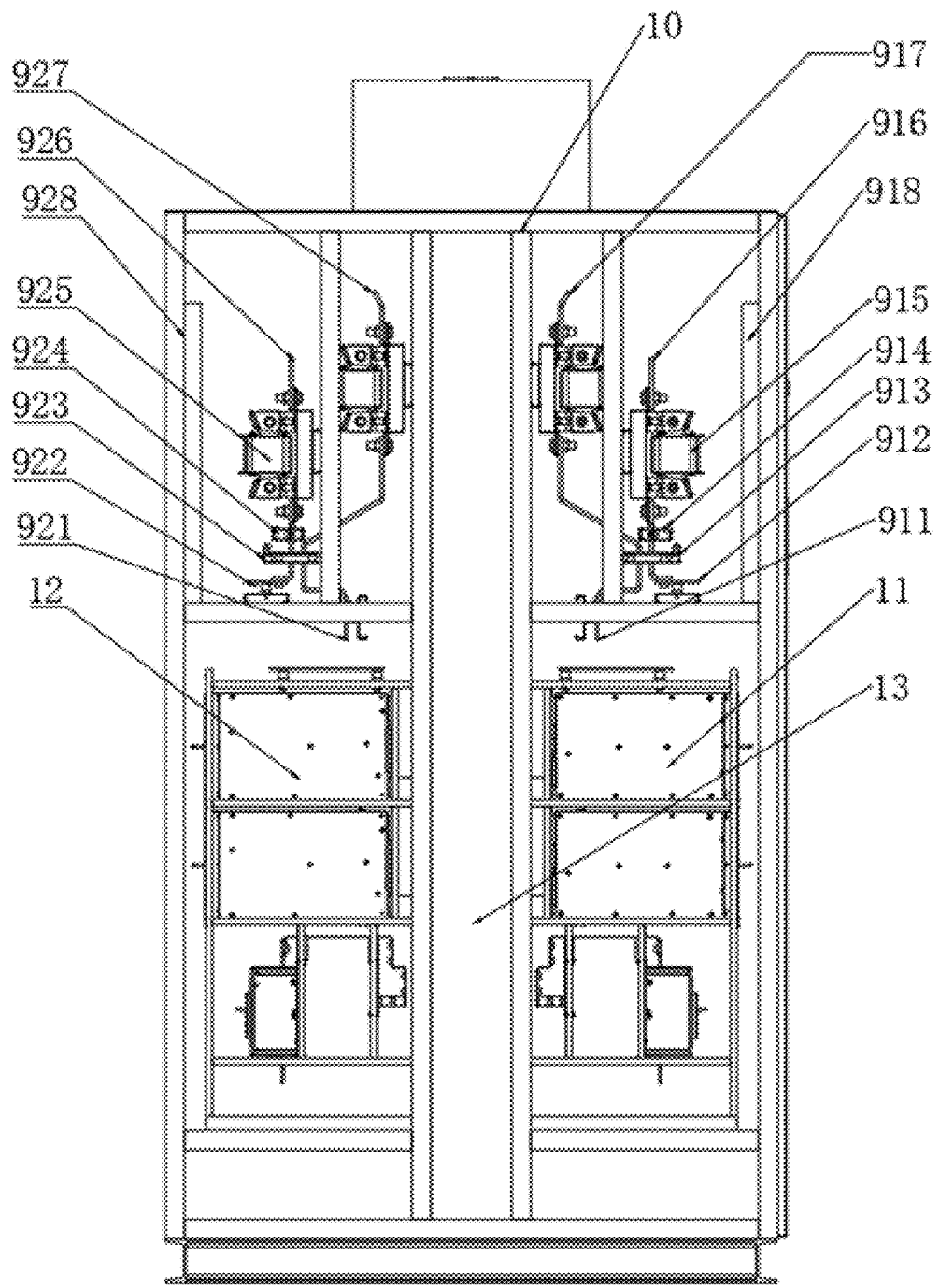

Please refer to FIG. 9A and FIG. 9B, which are structural diagrams of a rectifier cabinet provided according to an embodiment of the present application. The rectifier cabinet includes a rectifier cabinet body 10, a heat dissipation air duct 13, a first parallel assembly of rectifier modules 11, a first busbar positive pole 911, a first busbar negative pole 912, a first leakage current sensor 913, a first current sensor 914, a first fuse 915, a first load copper bar negative pole 916, a first load copper bar positive pole 917, a first monitoring circuit 918, a second parallel assembly of rectifier modules 12, a second busbar positive pole 921, a second busbar negative pole 922, a second leakage current sensor 923, a second current sensor 924, a second fuse 925, a second load copper bar negative pole 926, a second load copper bar positive pole 927 and a second monitoring circuit 928.

In this embodiment, for simplicity of description, the rectifier cabinet may be divided into a first accommodating space 804, a heat dissipation space 805 and a second accommodating space 806 from left to right along the X-axis direction through spacer structures such as partitions, frames or similar structures; and the rectifier cabinet may be divided into a DC collection and load branch layer 803, a rectifying layer 802 and an input cable layer 801 from top to bottom along the Y-axis direction through spacer structures such as partitions, frames or similar structures.

The middle heat dissipation air duct 13 exists in the heat dissipation space 805 of the rectifier cabinet body 10, and the first parallel assembly of rectifier modules 11 is arranged in the first accommodating space 804, and the first parallel assembly of rectifier modules 11 is arranged in the rectifying layer 802 in the height direction. The first busbar positive pole 911, the first busbar negative pole 912, the first leakage current sensor 913, the first current sensor 914, the first fuse 915, the first load copper bar negative pole 916, the first load copper bar positive pole 917 and the first monitoring circuit 918 are arranged in the first accommodating space 904, and they are all arranged in the DC collection and load branch layer 803 in the height direction.

In some embodiments, seven first parallel assemblies of rectifier modules 11 are arranged in the first accommodating space 804, and seven second parallel assemblies of rectifier modules 12 are arranged in the second accommodating space 805. Accordingly, one or more parallel assemblies of rectifier modules may be added or removed in the rectifier cabinet by those skilled in the art according to needs of the actual situation, and this is not limited by the attached drawings in the specification of the present application.

The second parallel assembly of rectifier modules 12 is arranged in the second accommodating space 805, and the second parallel assembly of rectifier modules 12 is arranged in the rectifying layer 802 in the height direction. The second busbar positive pole 921, the second busbar negative pole 922, the second leakage current sensor 923, the second current sensor 924, the second fuse 925, the second load copper bar negative pole 926, the second load copper bar positive pole 927 and the second monitoring circuit 928 are arranged in the second accommodating space 805, and they are all arranged in the DC collection and load branch layer 803 in the height direction.

In some embodiments, the non-wiring surface of the first parallel assembly of rectifier modules 11 with a handle faces the first cabinet door 840, and the wiring surface of the first parallel assembly of rectifier modules 11 opposite to the non-wiring surface faces the middle heat dissipation air duct 13. The non-wiring surface of the second parallel assembly of rectifier modules 11 with a handle faces the second cabinet door 850, and the wiring surface of the second parallel assembly of rectifier modules 12 opposite to the non-wiring surface faces the middle heat dissipation air duct 13.

In some embodiments, the installation connection surface of the first busbar positive pole 911 faces the first cabinet door 840, and the installation connection surface of the first busbar negative pole 912 faces the top plate 860 of the rectifier cabinet body 10. The mounting connection surface of the second busbar positive pole 921 faces the second cabinet door 850, and the mounting connection surface of the second busbar negative pole 922 faces the top plate 860 of the rectifier cabinet body 10.

In some embodiments, the communication interfaces between a plurality of first parallel assemblies of rectifier modules 11 are connected by signal harness, and the communication interfaces between a plurality of second parallel assemblies of rectifier modules 12 are connected by signal harness.

In some embodiments, the DC bus bar positive poles 410 of the plurality of first parallel assemblies of rectifier modules 11 are all connected to the first busbar positive pole 911, and the DC bus bar negative poles 420 of the plurality of first parallel assemblies of rectifier modules 11 are all connected to the first busbar negative pole 912. The DC bus bar positive poles 410 of the plurality of second parallel assemblies of rectifier modules 12 are all connected to the second busbar positive pole 921, and the DC bus bar negative poles 420 of the plurality of second parallel assemblies of rectifier modules 12 are all connected to the second busbar negative pole 922.

In some embodiments, the DC bus bar positive pole 410 of the first parallel assembly of rectifier modules 11 is connected to the first busbar positive pole 911 through a flexible cable, and the DC bus bar negative pole 420 of the first parallel assembly of rectifier modules 11 is connected to the first busbar negative pole 912 through a flexible cable. The DC bus bar positive pole 410 of the second parallel assembly of rectifier modules 12 is connected to the second busbar positive pole 921 through a flexible cable, and the DC bus bar negative pole 420 of the second parallel assembly of rectifier modules 12 is connected to the second busbar negative pole 922 through a flexible cable.

The first leakage current sensor 913 is arranged above the first busbar negative pole 912, the first current sensor 914 is arranged above the first leakage current sensor 913, the first fuse 915 is arranged above the first current sensor 914, and the first load copper bar negative pole 916 is arranged above the first fuse 915. In the horizontal direction, the first leakage current sensor 913, the first current sensor 914, the first fuse 915 and the first load copper bar negative pole 916 are all arranged at the middle position of the first accommodating space. The first load copper bar positive pole 917 is arranged at the side near the middle heat dissipation air duct 13. In the vertical height direction, the first load copper bar positive pole 917 is located above the first load copper bar negative pole 916, and a first fuse 915 is further arranged directly below the first load copper bar positive pole 917. The first monitoring circuit 918 is arranged at the inner side of the first cabinet door 840, and one first monitoring circuit 918 is arranged at the inner side of each of the left and right doors of the first cabinet door 840.

The first monitoring circuit 918 is connected to the first leakage current sensor 913, the first current sensor 914, the first fuse 915 and a first parallel assembly of rectifier modules 11 respectively.

The first busbar negative pole 912 is connected to the first load copper bar negative pole 916 through the first leakage current sensor 913, the first current sensor 915 and the first fuse 915, and the first busbar positive pole 911 is connected to the first load copper bar positive pole 917 through the first current sensor 914 and another first fuse 915.

The second leakage current sensor 923 is arranged above the second busbar negative pole 922, the second current sensor 924 is arranged above the second leakage current sensor 923, the second fuse 925 is arranged above the second current sensor 924, and the second load copper bar negative pole 926 is arranged above the second fuse 925. In the horizontal direction, the second leakage current sensor 923, the second current sensor 924, the second fuse 925 and the second load copper bar negative pole 926 are all arranged at the middle position of the second accommodating space. The second load copper bar positive pole 927 is arranged at the side near the middle heat dissipation air duct 13. In the vertical height direction, the second load copper bar positive pole 927 is located above the second load copper bar negative pole 926, and a second fuse 925 is further arranged directly below the second load copper bar positive pole 927. The second monitoring circuit 928 is arranged at the inner side of the second cabinet door 850, and one second monitoring circuit 928 is arranged at the inner side of each of the left and right doors of the second cabinet door 850.

The second monitoring circuit 928 is connected to the second leakage current sensor 923, the second current sensor 924, the second fuse 925 and a second parallel assembly of rectifier modules 12 respectively.

The second busbar negative pole 922 is connected to the second load copper bar negative pole 926 through the second leakage current sensor 923, the second current sensor 925 and the second fuse 925, and the second busbar positive pole 922 is connected to the second load copper bar positive pole 927 through the second current sensor 924 and another second fuse 925.

Different from the prior art, in the above embodiments, the present application provides a rectifier cabinet features a reasonable layout of components, a more compact structure, a higher power density, a shorter power conductor path, lower cost, and convenient installation and maintenance of components. The architecture of the rectifier cabinet of this scheme is also applicable to many fields such as high-voltage DC power supply systems of large data centers, large-scale charging systems of electric vehicles and energy storage systems.

Figure 10:
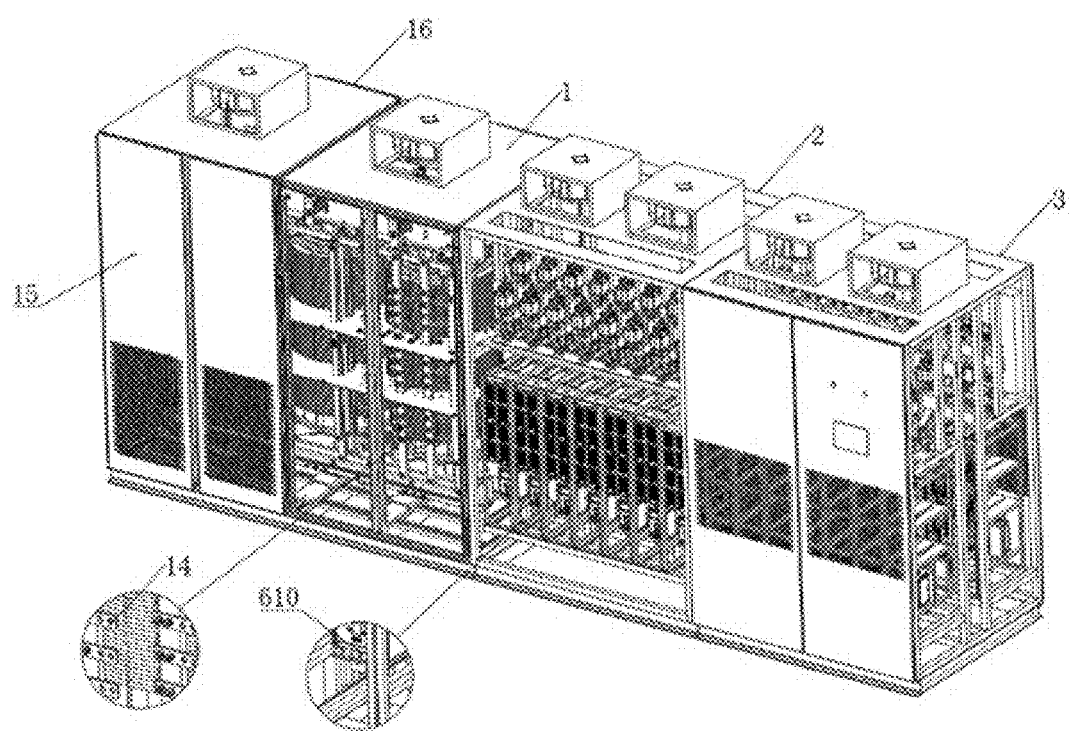
FIG. 10 is a schematic structural diagram of a DC power supply system according to an embodiment of the present application.

Please refer to FIG. 10, which is a schematic structural diagram of a DC power supply system according to an embodiment of the present application. The DC power supply system includes a transformer cabinet 1, a first rectifier cabinet 2 and a second rectifier cabinet 3.

The transformer cabinet 1, the first rectifier cabinet 2 and the second rectifier cabinet 3 are arranged side by side in the order of the transformer cabinet 1, the first rectifier cabinet 2 and the second rectifier cabinet 3 from left to right, and the left side of first rectifier cabinet 2 is close to the side of the transformer cabinet 1 on which the low-voltage winding wiring terminals are arranged. Alternatively, the transformer cabinet 1, the first rectifier cabinet 2 and the second rectifier cabinet 3 can be arranged side by side in the order of the transformer cabinet 1, the first rectifier cabinet 2 and the second rectifier cabinet 3 from right to left. The low-voltage winding wiring terminals are also arranged at the right side of the transformer cabinet 1 to keep close to the first rectifier cabinet 2.

A third cabinet door 15 and a fourth cabinet door 16 are respectively arranged on two opposite side surfaces of the transformer cabinet 1, and a plurality of low-voltage winding wiring terminals 14 are respectively arranged on one side near the third cabinet door 15 and one side near the fourth cabinet door 16 in the transformer cabinet, and the plurality of low-voltage winding wiring terminals 14 on one side near the third cabinet door 15 in the transformer cabinet 1 pass through the wire passage holes 831 on the side plate 830 of the first rectifier cabinet 2 respectively through low-voltage AC cables, and then are connected to the AC input copper bars 610 of the plurality of first parallel assemblies of rectifier modules 11 in the first accommodating space 804 in the first rectifier cabinet 2. A plurality of low-voltage winding wiring terminals 14 on one side near the fourth cabinet door 16 in the transformer cabinet 1 pass through the wire passage holes 831 on the side plate 830 of the first rectifier cabinet 3 respectively through low-voltage AC cables, and then are connected to the AC input copper bars 610 of the plurality of second parallel assemblies of rectifier modules 12 in the second accommodating space 805 in the first rectifier cabinet 2. The low-voltage AC cables are placed in the cable layer 801 of the first rectifier cabinet 2.

A plurality of low-voltage winding wiring terminals 14 on one side near the third cabinet door 15 in the transformer cabinet 1 pass through the wire passage holes 831 on the side plate 830 of the first rectifier cabinet 2 and the cable layer space of the first rectifier cabinet 2 respectively through low-voltage AC cables, and then are connected to the AC input copper bars 610 of the plurality of first parallel assemblies of rectifier modules 11 in the first accommodating space 804 in the second rectifier cabinet 3. A plurality of low-voltage winding wiring terminals 14 on one side near the fourth cabinet door 16 in the transformer cabinet 1 pass through the wire passage holes 831 on the side plate 830 of the first rectifier cabinet 3 and the cable layer space of the first rectifier cabinet 2 respectively through low-voltage AC cables, and then are connected to the AC input copper bars 610 of the plurality of second parallel assemblies of rectifier modules 12 in the second accommodating space 805 in the second rectifier cabinet 3. The low-voltage AC cables are placed in the cable layer 801 of the first rectifier cabinet 2 and the second rectifier cabinet 3.

Accordingly, one or more rectifier cabinets may be added or removed in the DC power supply system by those skilled in the art according to needs of the actual situation, and this is not limited by the attached drawings in the specification of the present application.

Different from the prior art, in the above embodiments, by arranging rectifier circuits at the front and back of the rectifier cabinet, the present application realizes a more compact system structure, a shorter low-voltage AC connection cable path between the transformer cabinet and the rectifier cabinet. The system has smaller volume, smaller footprint, and lower cost. Finally, all the hot air in the system is discharged from the top of the cabinet, which provides convenience for centralized collection and disposal of the hot air.

Finally, it shall be noted that the above embodiments are only used to illustrate the technical solutions of the present application, and are not intended to limit the present application. Under the idea of the present application, the technical features in the above embodiments or different embodiments may also be combined, and the steps may be implemented in any order. Many other variations of different aspects of the present application as described above are possible, and these variations are not provided in details for brevity. Although the present application has been described in detail with reference to the foregoing embodiments, as shall be appreciated by those skilled in the art, it is still possible to modify the technical solutions described in the foregoing embodiments, or equivalently replace some technical features thereof, and these modifications or replacements do not make the essence of the corresponding technical solutions depart from the scope of the technical solutions of the embodiments of the present application.

What is claimed is:

1. A parallel assembly of rectifier modules, comprising:
a plurality of rectifier modules connected in parallel;
a switch for switching-in and switching-out of the rectifier modules;
an assembly frame, being provided therein with a switch accommodating space and a rectifier module accommodating space which are sequentially arranged along the height direction;
a DC bus bar, being arranged at a top of the assembly frame and located outside the assembly frame; wherein the DC bus bar comprises a DC bus bar positive pole and a DC bus bar negative pole;
a plurality of groups of connectors, being fixed at one end close to a back side of the assembly frame and located in the rectifier module accommodating space; each group of connectors comprising an input connector and an output connector;
an AC copper bar, being fixed at one end close to a front side of the assembly frame and located in the switch accommodating space; wherein the AC copper bar comprises an AC input copper bar and an AC output copper bar;
an extended copper bar, being fixed at one end close to the back side of the assembly frame and located in the switch accommodating space;
wherein the AC input copper bar and the AC output copper bar are electrically connected with the switch, the extended copper bar is electrically connected with the AC output copper bar, and the extended copper bar is electrically connected with the input connector; the output connector is electrically connected with the DC bus bar;
the outer surface of the rectifier modules is provided with a pair of plug interfaces which are matched with a group of the connectors so that the rectifier modules installed in the rectifier module accommodating space are electrically connected with the input connector and the output connector through the plug interfaces.

2. The parallel assembly of rectifier modules according to claim 1, wherein the assembly frame comprises:
a plurality of plates straddling the assembly frame, and an interval exists between two adjacent plates in the height direction so that the rectifier module accommodating space is divided into two or more layers;
a connector bracket being fixedly connected to the end of the plate that is near the back side of the assembly frame; the connector is fixed on the connector bracket.

3. The parallel assembly of rectifier modules according to claim 2, wherein there is a guide groove on the plate;
the guide groove is configured to guide the rectifier module to move to a target installation position in the rectifier module accommodating space so that the plug interface of the rectifier module is plugged with the corresponding connector.

4. The parallel assembly of rectifier modules according to claim 1, wherein the rectifier module comprises:
a chassis, having two opposite surfaces provided with a plurality of ventilation holes to form an airflow channel for air passing through;
a cooling fan, being fixed at one end of the chassis to drive the air in the airflow channel;
circuit devices, being accommodated in the chassis.

5. The parallel assembly of rectifier modules according to claim 4, wherein the chassis further comprises:
a handle, being arranged on the first surface of the chassis;
a plurality of installation holes, being arranged on the first surface of the chassis and configured to fix the rectifier module;
a plurality of indicator lights, being arranged on the first surface of the chassis;
wherein the plug interface is arranged on a second surface of the chassis; and the first surface and the second surface are opposite.

6. The parallel assembly of rectifier modules according to claim 1, wherein the parallel assembly of rectifier module further comprises:
a plurality of rolling wheels, being arranged at the bottom of the assembly frame;
a communication interface, being arranged on the front side of the assembly frame;
both a communication connection end of the rectifier module and the control end of the switch are electrically connected with the communication interface.

7. The parallel assembly of rectifier modules according to claim 1, wherein the AC copper bar extends outward from the housing of the switch;
the extended copper bar comprises a copper bar body located at one end close to the back side of the assembly frame and a conductive connecting piece extending to the AC output copper bar;
wherein the extended copper bar and the input connector as well as the output connector and the DC bus bar is electrically connected by flexible cable.

8. A rectifier cabinet, comprising:
a rectifier cabinet body comprising: an installation frame, a base, two side plates, a top plate, a first cabinet door and a second cabinet door;
wherein the installation frame divides internal space of the rectifying cabinet into a first accommodating space, a heat dissipation space and a second accommodating space from left to right along the X-axis direction;
wherein the installation frame divides internal space of the rectifying cabinet into a DC collection and load branch layer, a rectifying layer and an input cable layer from top to bottom along the Y-axis direction;
wherein the first cabinet door and the second cabinet door are respectively located at two opposite side surfaces of the rectifier cabinet body;
wherein several wire passage holes are perforated at lower part of the side plate and two sides near the first cabinet door and second cabinet door of the top plate;
at least two parallel assembly of rectifier modules according to claim 1,
wherein the parallel assembly of rectifier modules located in the first accommodating space is first parallel assembly of rectifier modules, and the parallel assembly of rectifier modules located in the second accommodating space is second parallel assembly of rectifier modules;
wherein a non-wiring surface at one end of the first parallel assembly of rectifier modules is close to the first cabinet door, and a wiring surface at the other end of the first parallel assembly of rectifier modules is close to the heat dissipation air duct; a non-wiring surface at one end of the second parallel assembly of rectifier modules is close to the second cabinet door, and a wiring surface at the other end of the second parallel assembly of rectifier modules is close to the heat dissipation air duct;
wherein a left door and a right door of the first cabinet door and a left door and a right door of the second cabinet door are all opened with ventilation holes in the height direction, and the height of the ventilation holes is not higher than that of the first parallel assembly of rectifier modules and the second parallel assembly of rectifier modules.

9. The rectifier cabinet according to claim 8, wherein the rectifier cabinet further comprises:
busbars respectively positioned above the first parallel assembly of rectifier modules and the second parallel assembly of rectifier modules; wherein the busbars comprise a first busbar located above the first parallel assembly of rectifier modules and a second busbar located at the second parallel assembly of rectifier modules,
wherein the first busbar comprises a first busbar positive pole and a first busbar negative pole, an installation connection surface of the first busbar positive pole faces the first cabinet door, and an installation connection surface of the first busbar negative pole faces the top of the rectifying cabinet;
the second busbar comprises a second busbar positive pole and a second busbar negative pole, an installation connection surface of the second busbar positive pole faces the second cabinet door, and an installation connection surface of the second busbar negative pole faces the top of the rectifier cabinet body;
wherein the DC bus bar positive pole is connected to the first busbar positive pole or the second busbar positive pole, and the DC bus bar negative pole is connected to the first busbar negative pole or the second busbar negative pole.

10. The rectifier cabinet according to claim 8, wherein the rectifier cabinet further comprises: a plurality of load copper bars comprising load copper bar positive poles and load copper bar negative poles, a plurality of fuses and a plurality of current sensors;
wherein the plurality of load copper bar positive poles, the plurality of load copper bar negative poles, the plurality of fuses and the plurality of current sensors are arranged in a staggered way along the height direction of the rectifying cabinet;
the plurality of load copper bar positive poles, the plurality of load copper bar negative poles, the plurality of fuses and the plurality of current sensors are arranged in parallel along the width direction of the rectifier cabinet body; the installation connection surfaces of the plurality of load copper bar positive poles and the plurality of load copper bar negative poles all face the first cabinet door or the second cabinet door.

11. The rectifier cabinet according to claim 8, wherein the rectifying cabinet comprises:
an installation frame located at the bottom of the rectifier cabinet body; wherein the installation frame of the parallel assembly of rectifier modules is matched with the assembly frame of the parallel assembly of rectified modules; the parallel assembly of rectifier modules is fixed on the installation frame of the parallel assembly of rectifier modules in a detachable way.

12. The rectifier cabinet according to claim 8, wherein the rectifier cabinet body further comprises:
a fan, being installed at the top of the rectifier cabinet body, an air inlet of the fan is connected with an air outlet of the heat dissipation air duct of the rectifier cabinet.

13. The rectifier cabinet according to claim 8, wherein the rectifier cabinet body further comprises:
a first monitoring circuit connected to the first parallel assembly of rectifier modules and a second monitoring circuit connected to the second parallel assembly of rectifier modules;
wherein the first monitoring circuit is arranged at the inner side of the first cabinet door and the second monitoring circuit is arranged at the inner side of the second cabinet door;
a first display screen and a plurality of first indicator lights connected to the first monitoring circuit, and a second display screen and a plurality of second indicator lights connected to the second monitoring circuit;
wherein the first display screen and the first indicator lights are arranged at the outer side of the first cabinet door; the second display screen and the second indicator lights are arranged at the outer side of the second cabinet door.

14. The rectifier cabinet according to claim 13, wherein a communication interface of each of the parallel assemblies of rectifier modules is connected to the nearest monitoring circuit.

15. The rectifier cabinet according to claim 13, wherein the first monitoring circuit is further connected to the first leakage current sensor, the first current sensor and the first fuse; and the second monitoring circuit is further connected to the second leakage current sensor, the second current sensor and the second fuse.

16. A direct current (DC) power supply system comprising:
- a transformer cabinet, having two opposite side surfaces respectively provided with a third cabinet door and a fourth cabinet door, and both one side close to the third cabinet door and one side close to the fourth cabinet door in the transformer cabinet are provided with low-voltage winding wiring terminals; and
- the rectifier cabinet according to claim 8, wherein the rectifier cabinet located at one side of the transformer cabinet on which the winding wiring terminals are arranged and a AC (Alternating Current) output end of the transformer cabinet is connected to the rectifier cabinet.

* * * * *